United States Patent [19]
Jeon et al.

[11] Patent Number: 6,090,632
[45] Date of Patent: Jul. 18, 2000

[54] METHOD FOR CONTROLLING SEMICONDUCTOR PROCESSING EQUIPMENT IN REAL TIME

[75] Inventors: Heui-sik Jeon; Jong-hwan Weon, both of Kyonggi-do, Rep. of Korea

[73] Assignee: Samsung Electronics Co., Ltd., Suwon, Rep. of Korea

[21] Appl. No.: 09/146,751

[22] Filed: Sep. 4, 1998

[30] Foreign Application Priority Data

Dec. 5, 1997 [KR] Rep. of Korea ............. 97 66130

[51] Int. Cl.[7] .......................................... G01R 31/26
[52] U.S. Cl. ...................................... 438/14; 324/765
[58] Field of Search ................... 438/14, 17; 324/765

[56] References Cited

U.S. PATENT DOCUMENTS

| | | | |
|---|---|---|---|
| 5,321,354 | 6/1994 | Ooshima et al. | 324/765 |
| 5,910,011 | 6/1999 | Cruse | 438/16 |
| 5,927,512 | 7/1999 | Beffa | 209/573 |
| 5,940,300 | 8/1999 | Ozaki | 438/14 |

*Primary Examiner*—John F. Niebling
*Assistant Examiner*—John Murphy
*Attorney, Agent, or Firm*—Jones Volentine, LLP

[57] ABSTRACT

A method for controlling semiconductor processing equipment in real time, includes measuring a characteristic value of a product of a first process performed by a first piece of equipment. Then it is determined whether the characteristic value of the product is within a predetermined acceptable product range stored in a host computer. A second process is stopped from operating on the product when the product is not within the range. Otherwise, when the product is within range, the process is tested using a main test that includes computing a main statistic using the characteristic value of the product and determining whether the main statistic is within a predetermined control limit range. Then, if the main test is not passed, the process is interrupted, including stopping the first piece of equipment and postponing the second process from operating on the product.

25 Claims, 5 Drawing Sheets

METHOD FOR CONTROLLING SEMICONDUCTOR PROCESSING EQUIPMENT IN REAL TIME

BACKGROUND OF THE INVENTION

1. Field of the Invention

The present invention relates to a method for controlling semiconductor processing equipment and, more particularly, to a method for controlling semiconductor processing equipment in real time based on measured data.

2. Description of the Related Art

A semiconductor device is typically fabricated through a large number of unit processes executed in sequence. Accordingly, a large number of sophisticated pieces of equipment, such as sputtering equipment and etching equipment, are disposed along a semiconductor processing line to perform the sequence of unit processes. FIG. 1 is a flowchart of a conventional method for controlling such semiconductor processing equipment.

Referring to FIG. 1, semiconductor processing equipment are controlled by determining whether or not unit processes are being performed using the optimal process settings for each. Optimal settings are determined by measuring characteristic values of a product produced after several processes and comparing those characteristic values to characteristic values and corresponding equipment settings saved in a database of a host computer. The measurements and settings data are displayed on a monitor of an operator interface (O/I), for example a personal computer (PC), in real time. Then, using a computer program run, for example, from the O/I PC, it is determined whether or not the proper settings were applied to the product by comparing the displayed measurement data with initially set optimal settings data. If it is determined that the product is defective, the product is reprocessed or discarded, and appropriate action is taken to repair or reset the equipment to solve problems in the unit processes themselves.

However, the conventional method for controlling the processing equipment suffers from several problems. The measurements are only displayed in real time at the O/I, not analyzed in real time. When an error is detected as a result of the analysis, the detection usually occurs after a series of several unit processes have been performed in sequence. Therefore, the operator has to trace back through several pieces of equipment to determine in which piece of equipment and during which process the error occurred. Thus, a series of appropriate but time consuming actions have to be taken with the equipment to isolate and solve problems in the equipment. Accordingly, even with the real time display of measurements and data used by the conventional method, it takes a great amount of time to analyze the measured data to detect a faulty unit process and to take the corrective action to reset or repair the malfunctioning equipment. As a result, the faulty process may continue to be performed on many products using the malfunctioning equipment during the time the analysis is performed and before the error is corrected. Thus a large number of defective products are produced that have to be reprocessed or discarded, causing waste and reducing the productivity of the processing line.

In addition, the conventional method does not detect faulty processes in advance of a defective product, and thus can not prevent the production of any defective products. The faulty process may be due to an improper setting as a result of a mistake by an engineer, or the faulty process may be due to the equipment's own hardware problems. In either case, several lots, each including a plurality of wafers, are continuously processed with the faulty process, leading to a large number of non-optimal products. This continues undetected until the defective products are finally produced and measured. Then, as a result of the time-consuming analysis, even more time is lost until the defective products are detected and the problem is isolated and corrective action is taken.

SUMMARY OF THE INVENTION

It is therefore an object of the present invention to provide a method for controlling semiconductor processing equipment in real time, so as to prevent the production of defective products in advance.

To achieve the above object and other objects and advantages of the present invention, a method for controlling semiconductor processing equipment in real time includes measuring a characteristic value of a product of a first process performed by a first piece of equipment. Then it is determined whether the characteristic value is within a predetermined acceptable product range stored in a host computer. A second process is stopped from operating on the product when the product is not within the range. Otherwise, when the product is within range, the process is tested using a main test that includes computing a main statistic using the characteristic value and determining whether the main statistic is within a predetermined control limit range. Then, if the main test is not passed, the process is interrupted, including stopping the first piece of equipment and postponing the second process from operating on the product.

In another aspect of the invention, the process testing includes a subtest which is performed when the process passes the main test. Then, if the subtest is not passed, the process is interrupted.

As a result of controlling semiconductor processing equipment according to the present invention, the unit processes can be controlled in real time using measured data so that the process is stopped as soon as testing indicates a problem, and even before a defective product is produced. Therefore, it is possible to prevent the production of defective products due to a faulty process in advance. In addition, it is possible to catch defective products and remove them from processing in subsequent steps, thus preventing a wasting of resources.

BRIEF DESCRIPTION OF THE DRAWINGS

The present invention and preferred embodiments thereof are described in detail with reference to the accompanying drawings, in which.

DETAILED DESCRIPTION OF THE PREFERRED EMBODIMENTS

The present invention will be described more fully hereinafter with reference to the accompanying drawings, in which preferred embodiments of the invention are shown.

Figure 1:
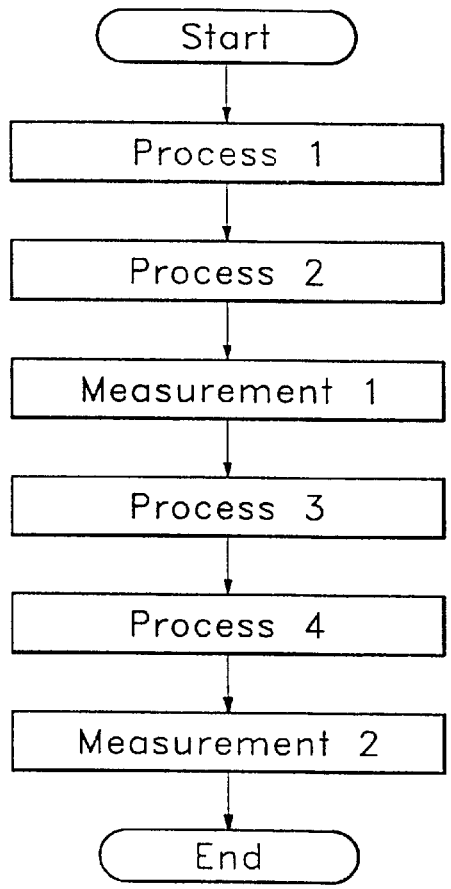
FIG. 1 is a flowchart of a conventional method for controlling semiconductor processing equipment.
Figure 2:
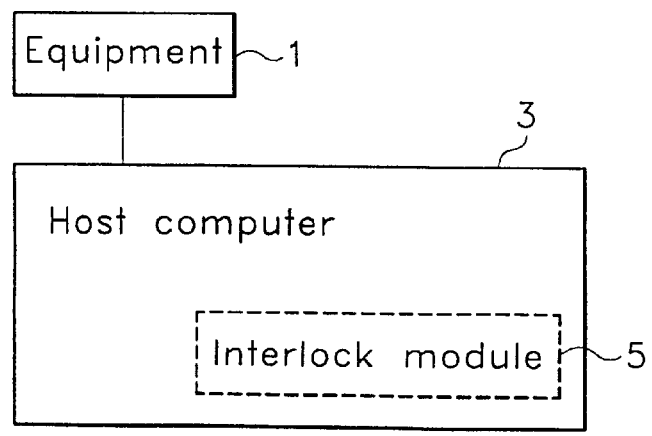
FIG. 2 is a schematic block diagram of a system for controlling semiconductor processing equipments according to the present invention.

FIG. 2 is a schematic block diagram of a system for controlling semiconductor processing equipment in real time according to the present invention. As shown in FIG. 2, the system includes a piece of equipment 1 in which a first unit process is carried out. The system also includes a host computer 3 in which are stored optimal settings and specification ranges for measured characteristic values for the respective unit processes. The host computer includes an interlock module 5 capable of automatically stopping the operation of the equipment 1, hence stopping the first process, and also capable of stopping the following unit processes, including a second process, operating on the products of the first process. The equipment 1 is connected on-line to the host computer 3 so that the interlock module 5 of the host computer 3 can transmit and receive data to and from the equipment 1 smoothly.

Figure 3A:
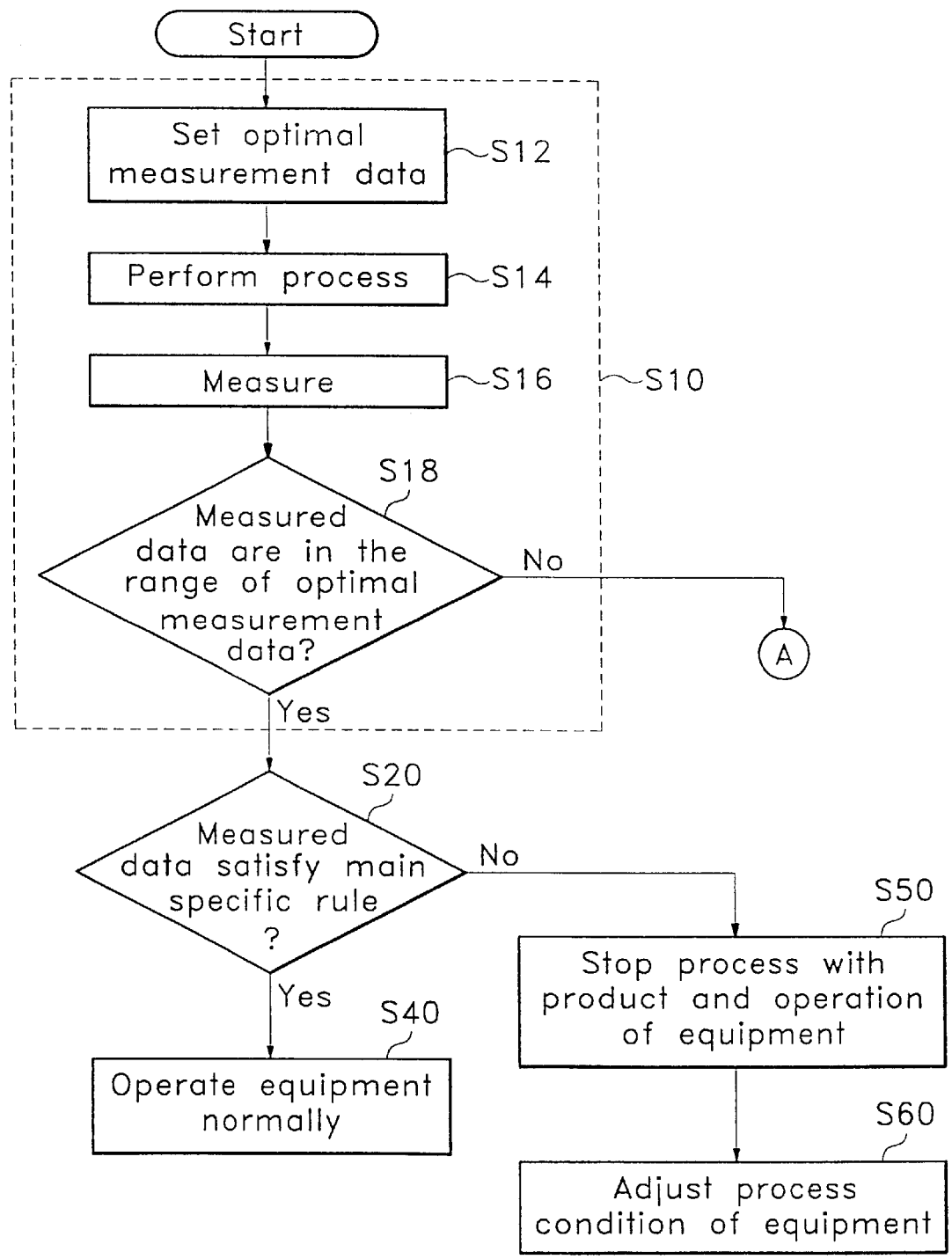
FIGS. 3A and 3B are flowcharts for a method for controlling semiconductor processing equipment in real time according to the present invention.
Figure 3B:
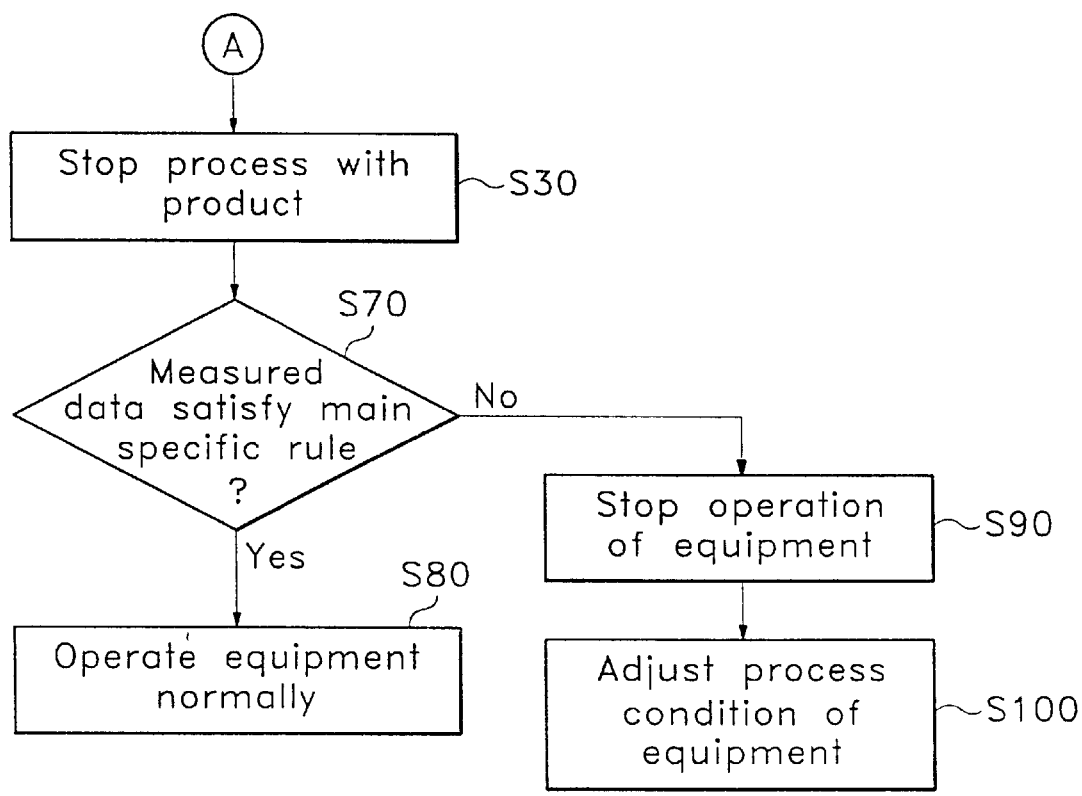

FIG. 3A and 3B illustrate a flowchart of a method for real time controlling semiconductor processing equipments using the system of FIG. 2. Referring to FIGS. 2, 3A and 3B, the method is described in detail.

At step S10, it is determined whether measurements of a characteristic value of a product completed through the first unit process are within the range of optimal values for such a product. This range of optimal values constitutes a predetermined acceptable product range that is stored in the host computer.

In the preferred embodiment, the step S10 includes four sub-steps S12, S14, S16 and S18. At step S12, the range of optimal values constituting a predetermined acceptable product range is set and stored in the host computer. At step S14, the first process is executed in the first piece of equipment on a unit lot including 20 to 25 wafers. After this step the wafers are products of the first process. At step S16, a characteristic value of a product completed through the first process is obtained by measurement and reported to the host computer. At step S18, it is determined whether the measured and reported characteristic value is within the range of optimal values or not. The range of the optimal values sets the extreme limits for the characteristic values that do not adversely affect the product, i.e., for which the product is not defective.

If it is determined in step S10 that the measured characteristic value is in the range of the optimal values, then the product is not defective, i.e., the product is a "passed" product, and it would appear the passed product would be produced by a "normal" process. However, even though the process produces a passed product, the process might still be faulty or "abnormal" in some regard as indicated by the measured characteristic value. Such an abnormal process may be prone to getting worse, leading eventually to defective products. Another reason for further testing the process when the products are not defective is that the products of the abnormal process are subsequently processed through following processes on the processing line; and the possibility of failure in those processes may be increased by the abnormal first process. Therefore the process is tested even when the product is not defective, i.e., even when the measured characteristic value is within the range of optimal values.

The process testing includes a main test S20 which involves a determination as to whether or not a main statistic computed from the measured characteristic value satisfies a main specific rule. In the preferred embodiment, the main specific rule is a maximal control limit range, for example, a control limit ranged from an upper control limit (UCL) to a lower control limit (LCL), as used in statistical process control (SPC). In this embodiment the main statistic is a control limit calculated from the measured characteristic values of several products produced through the first process. The control limit may serve as an index of changes in the process. In other words, when the statistical properties of measured characteristic values of the first process are not in the range of the control limit, the indications are that some operational fault is occurring in the first piece of equipment.

Because of process testing, including step S20, the possibility of defective products down the processing line, or the possibility of future defective products of the first process, or both, can be detected and prevented in advance.

If, at step S20, it is determined that the main statistic computed from the measured characteristic value does not satisfy the main specific rule, i.e., that the process does not pass the main test, then the process is interrupted by the interlock module 5. Interrupting the process includes stopping the first piece of equipment and postponing the execution of the second process on the passed product at step S50.

In the preferred embodiment, after step S50, while the operation of the first piece of equipment and the second process with the product are interrupted, a series of actions to adjust the process settings in the stopped first piece of equipment are taken by an engineer working on the process line. If the resetting does not fix the problem, then hardware repair to the first piece of equipment is necessary. One way or the other, or both, the problems in the first piece of equipment are solved at step S60, during the interruption. When the problems are solved, the second process is resumed to act on the passed product, and the first piece of equipment is re-operated, thus ending the interruption.

If it is determined that the process passes the process testing, then, at step S40, the method proceeds normally. Proceeding normally includes operating the first piece of equipment normally and executing normally the second process operating on the passed product of the first process.

If it is determined back at step S10 that the measured characteristic values are not in the range of the optimal values, the product is defective, i.e., the product is a "failed" product and it would appear the failed process is produced by a "defective" process. In this case, in step S30, subsequent processing on the failed product is stopped and the first piece of equipment is also stopped by an interlock module 5 installed in the host computer. That is, at step S30 a second process is stopped from operating on the product from the first process. By stopping further processing on the defective product, time and other processing line resources are saved leading to greater productivity of the line.

If the product has failed, it could be due either to a problem in that particular product, e.g., a flaw in the wafer, or to a problem in the process, i.e., malfunctioning equipment. In the former case, it is not necessary to interlock the equipment and stop further processing. If the latter case, a possible problem has been isolated in real time to the first piece of equipment, thus saving time for analysis and corrective action.

Therefore, in the preferred embodiment, if the product has failed, process testing is still performed to help analyze whether the process is at fault, i.e., whether the equipment is malfunctioning. Thus, in the preferred embodiment, after the process with the product is stopped at step S30, process testing is performed again, including making a second determination as to whether the measured characteristic values pass the main test at step S70. If it is determined that the process passes the process testing, the first piece of equipment is operated normally at step S80.

If it is determined, in the preferred embodiment, that the process does not pass the process testing, then the process itself is "defective" and the process is halted by stopping the operation of the first piece of equipment using the interlock module 5 at step S90. Thereafter, a series of appropriate actions (S100) are taken to adjust the process settings or repair the first piece of equipment 1 so that the process problems can be solved. When the problems are solved the first piece of equipment is re-operated to begin processing other products.

In the preferred embodiment, information on the series of appropriate actions taken at the steps S60 and S100 is automatically saved in the host computer. Thereafter, the saved information on the actions taken can be used in finding important factors to be included among interlock options when the first piece of equipment performs the first process on other products. When the equipment is stopped, interrupted or halted, the operator or the engineer is informed of the fact by means of information displayed on the monitor of the on-line O/I, depending on whether an alarm signal is generated. In this way, the operator or the engineer can rapidly cope with the situation.

The above steps are repeatedly carried out, substituting the next piece of equipment for the first piece of equipment or substituting the next product for the present product or both, until the fabrication of the semiconductor devices on the process line is completed.

Figure 4A:
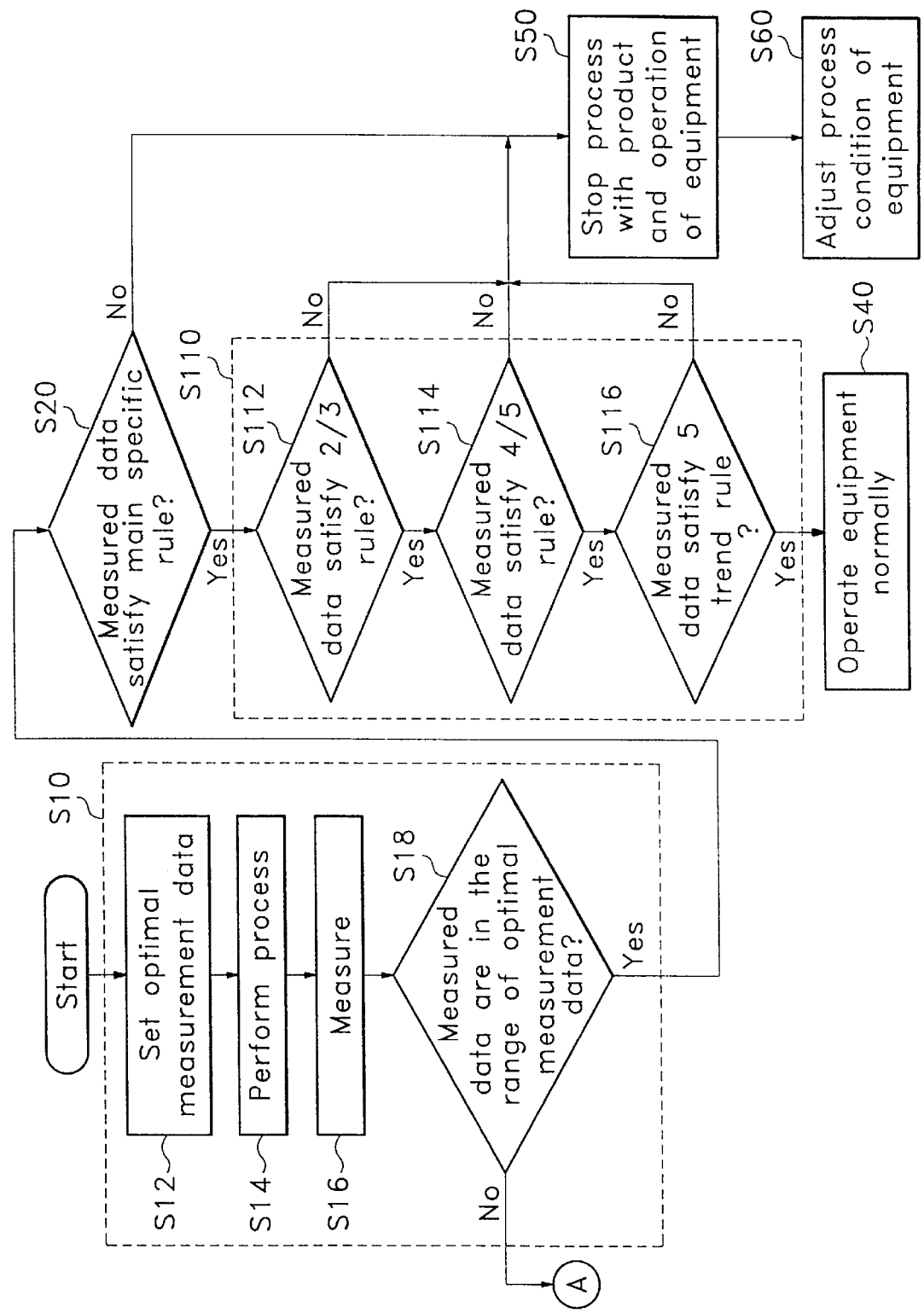
FIGS. 4A and 4B are flowcharts for a modified embodiment of the method illustrated in FIGS. 3A and 3B.
Figure 4B:
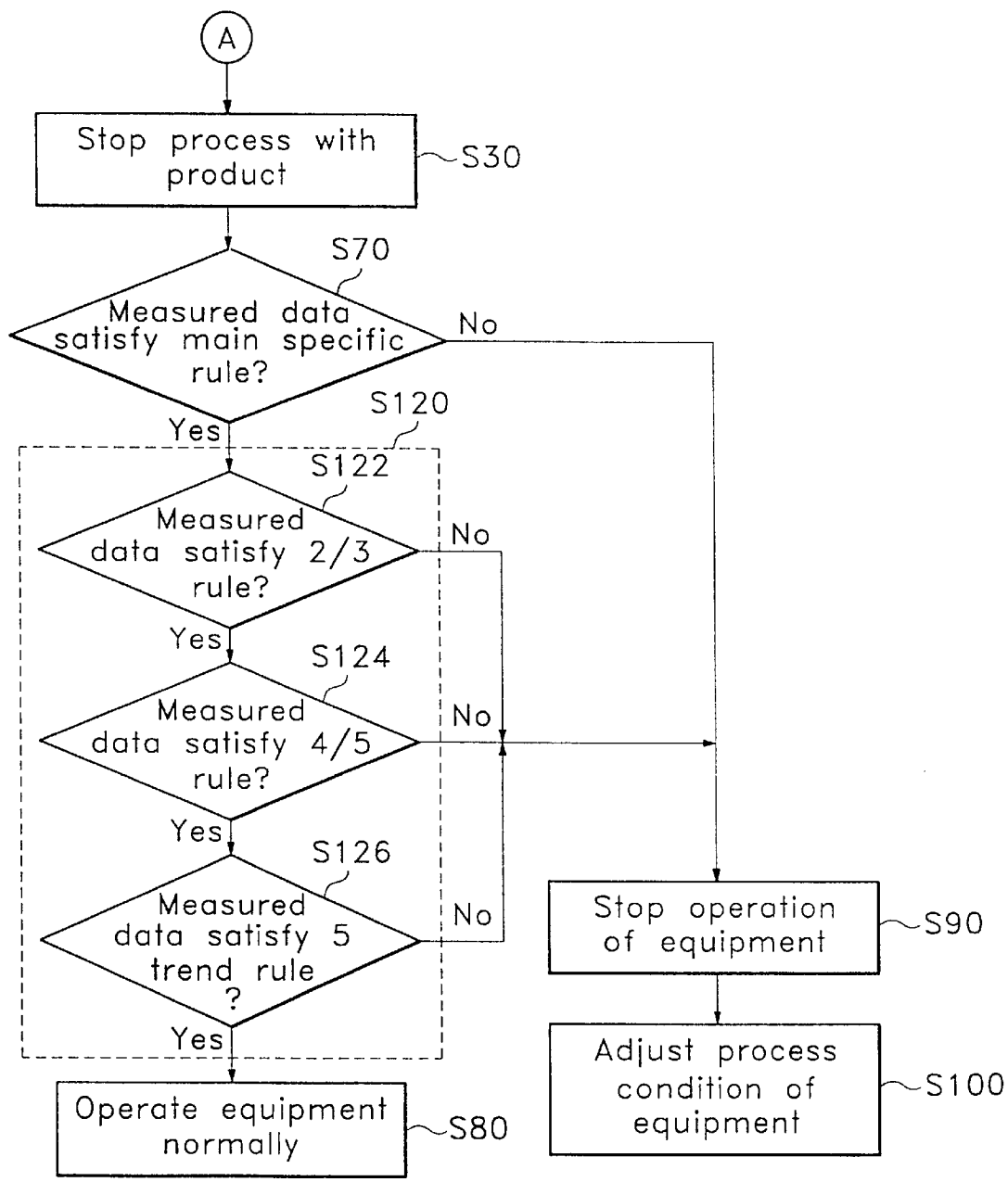

In the preferred embodiments, the method is modified as shown in FIGS. 4A and 4B in which process testing further includes process subtesting S110, S120 after the main testing S20, S70 for the normal/abnormal process and the defective process, respectively. That is, in FIG. 4A step S110 is further included between steps S20 and S40, and in FIG. 4B step S120 is further included between steps S70 and S80. In other embodiments either step S110 or step S120 can be eliminated.

In an embodiment including step S110, if the passed product process passes the main test then the process is tested again with a subtest. If the process passes the subtest, then processing proceeds normally, as described above. If the process does not pass the subtest, then the first process is considered an abnormal process. In this case, the method continues with the interrupting step S50 described earlier.

In an embodiment including step S120, if the failed product process passes the main test then the process is tested again with a subtest. If the process passes the subtest, then the process passes the process testing and the equipment is operated normally, as described above. If the process does not pass the subtest, then the first process is considered a defective process. In this case, the method halts the processing in Step S90 which includes stopping the first piece of equipment as described earlier.

The subtests use sub-specific rules for control limits on statistics derived from the measured characteristic values over several different products that are generally used in statistical process control (SPC). In the preferred embodiments, a $2/3$ rule, a $4/5$ rule and a 5-trend rule are all used as the sub-specific rules and are defined in terms $\delta$, the square root of the variance of the distribution of characteristic values. The measured characteristic value does not satisfy the $2/3$ rule when two of successive three measured characteristic values exist in a zone between $2\delta$ and $3\delta$. The measured characteristic value does not satisfy the $4/5$ rule when four of successive five measured characteristic values do not exist in a zone between $-1\delta$ and $1\delta$. The measured characteristic value does not satisfy the 5-trend rule when at least five measured characteristic values are in a continuously increasing trend or a continuously decreasing trend.

In other embodiments with subtests S110, S120, only one or two of these sub-specific rules are utilized. The sub-specific rules to be combined depend on what the first and second processes are. In the present invention, the sub-specific rules are applied to the method in seven combinations as follows. Using multiple sub-specific rules helps to prevent a reduction in the process line productivity cause by failure to recognize a faulty process. The subtesting applied in steps S110 or S120 may include: (1) all the sub-specific rules, i.e., the $2/3$ rule, the $4/5$ rule and the 5-trend rule combined; (2) only the $2/3$ rule; (3) only the $4/5$ rule; (4) only the 5-trend rule; (5) the $2/3$ rule and the $4/5$ rule combined; (6) the $2/3$ rule and the 5-trend rule combined; or (7) the $4/5$ rule and the 5-trend rule combined.

First, passed product subtesting S110 is described. The description of these 7 combinations of the sub-specific rules is provided in terms of the preferred embodiment in which all three sub-specific rules are included—combination (1). In this case, the step S110 is divided into three steps S112, S114 and S116.

At step S112, it is determined whether the measured characteristic value satisfies, ie., passes, the $2/3$ rule or not. If it is determined that the measured characteristic value fails, i.e., does not satisfy, the $2/3$ rule then the process does not pass the subtest, and the method continues as described above for the case when the first process is an abnormal process. If it is determined that the measured data passes the $2/3$ rule, then this embodiment continues with step S114.

At step 114, it is then determined whether the measured characteristic value passes the $4/5$ rule or not. If it is determined that the measured characteristic value fails the $4/5$ rule, then the process does not pass the subtest, and the method continues as described above for the case when the first process is an abnormal process. If it is determined that the measured characteristic value passes the $4/5$ rule, then this embodiment continues with step S116.

At step 116, it is then determined whether the measured characteristic value passes the 5-trend rule or not. If it is determined that the measured characteristic value fails the 5-trend rule, then the process does not pass the subtest, and the method proceeds as described above for the case when the first process is an abnormal process. If it is determined that the measured characteristic value passes the 5-trend rule, then the first process passes the subtesting and the method proceeds as described above for the case when the first process is a normal process.

The embodiments of step S110 employing the other combinations of the sub-specific rules from (2) to (7) are essentially similar to the above described embodiment employing the combination of (1), except that one or two of steps S112, S114 and S116 are eliminated and any resulting logical gap is bridged in a way that is evident to a person of ordinary skill in the art. Therefore, the detailed description of these other embodiments are omitted.

Next, failed product subtesting S120 is described. Similarly, the description of the 7 combinations of the sub-specific rules is provided in terms of the preferred embodiment in which all three sub-specific rules are included—combination (1). In this case, the step S120 is divided into three steps S122, S124 and S126.

At step S122, it is determined whether the measured characteristic value passes the $2/3$ rule or not. If it is determined that the measured characteristic value fails the $2/3$ rule then the process does not pass the subtest, and the method continues as described above for the case when the first process is a defective process. If it is determined that the measured data passes the ⅔ rule, then this embodiment continues with step S124.

At step 124, it is then determined whether the measured characteristic value passes the ⅘ rule or not. If it is determined that the measured characteristic value fails the ⅘ rule, then the process does not pass the subtest, and the method continues as described above for the case when the first process is a defective process. If it is determined that the measured characteristic value passes the ⅘ rule, then this embodiment continues with step S126.

At step 126, it is then determined whether the measured characteristic value passes the 5-trend rule or not. If it is determined that the measured characteristic value fails the 5-trend rule, then the process does not pass the subtest, and the method proceeds as described above for the case when the first process is a defective process. If it is determined that the measured characteristic value passes the 5-trend rule, then the first process passes the subtesting and the method proceeds as described above for the case when the first process is a normal process.

The embodiments of step S120 employing the other combinations of the sub-specific rules from (2) to (7) are essentially similar to the above described embodiment employing the combination of (1), except that one or two of steps S122, S124 and S126 are eliminated and any resulting logical gap is bridged in a way that is evident to a person of ordinary skill in the art. Therefore, the detailed description of these other embodiments are omitted.

When both S110 and S120 process subtesting are employed, the combination of sub-specific rules utilized in the two subtests S110 and S120 need not be the same. For example, the passed product subtest S110 may use combination (1) while the failed product subtest S120 may use combination (7).

When the semiconductor processing equipment is controlled according to the present invention, it is possible to control the processes performed in the equipment in real time. As a result, a series of appropriate actions such as stopping, interrupting or halting the process line can be taken as soon as problems occur. Therefore, performing a faulty process on a large number of products can be prevented. In contrast, a faulty process may be performed on a large number of products in a conventional system in which a chance to solve the problems of a first process in real time is lost.

The method according to the present invention may be performed in real time as aforementioned and may be performed in such a manner that certain processes that may cause process problems, as well as a process right before a measuring process, are interlocked together and can be stopped all at once. In addition, the method may be performed in such a manner that only certain important processes selected by the operator are controlled as aforementioned by real time measurements and analysis.

According to the present invention, it is possible to determine whether a process is performed under optimal conditions right after a measuring step is completed. Therefore, performing faulty processing on many products and subsequent processing of defective products, both associated with lost chances to stop, interrupt, or halt, may be prevented in advance. In addition, since faulty processing is determined based on a variety of statistical measures, the causes of the faulty process, for example, incorrect settings or hardware problems, can be accurately and rapidly detected.

The present invention has been described above with reference to the example and preferred embodiments. It should be evident to those of ordinary skill in the art, however, that many alternatives, modifications and variations can be made to the embodiments described, such as changing the order of operation of the sub-specific rules in the seven combinations used in process subtesting, and still fall within the spirit and scope of the invention as defined in the appended claims and their equivalents.

What is claimed is:

1. A method for controlling semiconductor processing equipment in real time, the equipment sequentially performing first and second semiconductor fabrication processes on a product and including a first piece of equipment for performing the first fabrication process, said method comprising:

measuring a characteristic of a product of the first fabrication process performed by the first piece of semiconductor fabrication equipment, and ascribing a value to the measured characteristic, whereby said value is a characteristic value of the product;

determining whether the characteristic value is within a predetermined acceptable range stored in a host computer, and if so, designating the product a passed product, otherwise designating the product a failed product;

if the product is designated a failed product, stopping the semiconductor processing equipment from performing the second fabrication process on the failed product;

if the product is designated a passed product, conducting a main test on the first fabrication process, the main test including computing a statistic using the characteristic value ascribed to the measured characteristic of the product and determining whether the statistic is within a predetermined control limit range, and if so, designating the first fabrication process a normal process, otherwise designating the first fabrication process an abnormal process; and if the first fabrication process is designated an abnormal process, stopping the first piece of semiconductor processing equipment and postponing the performing of the second fabrication process on the passed product.

2. The method of claim 1, wherein if the product is the failed product, further comprising:

conducting the main test on the first process;

if the statistic is within the predetermined control limit range, designating the first process a normal process, otherwise designating the first process a defective process; and if a defective process, halting the defective process, including stopping the first piece of equipment.

3. The method of claim 1, wherein if the first process is a normal process, executing the second process on the passed product and operating the first piece of equipment to produce another product.

4. The method of claim 2, wherein if the first process is a normal process, operating the first piece of equipment to produce another product.

5. The method of claim 1, wherein, during said main testing, the statistic is a maximal control limit of a statistical process control; and the predetermined control limit range extends from a lower control limit to an upper control limit.

6. The method of claim 1, wherein, if the product is a passed product and the first process is a normal process, further comprising subtesting of the normal process, and re-designating the normal process an abnormal process if the subtesting is failed.

7. The method of claim 2, wherein, if the product is a failed product and the first process is a normal process, further comprising subtesting of the normal process and re-designating the normal process a defective process if the subtesting is failed.

8. The method of claim 6, the subtesting comprising determining whether or not the characteristic value satisfies a statistical process control ⅔ rule.

9. The method of claim 6, the subtesting comprising determining whether or not the characteristic value satisfies a statistical process control ⅘ rule.

10. The method of claim 6, the subtesting comprising determining whether or not the characteristic value satisfies a statistical process control 5-trend rule.

11. The method of claim 8, wherein if the characteristic value satisfies the ⅔ rule, the subtesting further comprising determining whether or not the characteristic value satisfies the statistical process control ⅘ rule.

12. The method of claim 8, wherein if the characteristic value satisfies the ⅔ rule, the subtesting further comprising determining whether or not the characteristic value satisfies the statistical process control 5-trend rule.

13. The method of claim 9, wherein if the characteristic value satisfies the ⅘ rule, the subtesting further comprising determining whether or not the characteristic value satisfies the statistical process control 5-trend rule.

14. The method of claim 11, wherein if the characteristic value satisfies the ⅘ rule, the subtesting further comprising determining whether or not the characteristic value satisfies the statistical process control 5-trend rule.

15. The method of claim 7, the subtesting comprising determining whether or not the characteristic value satisfies a statistical process control ⅔ rule.

16. The method of claim 7, the subtesting comprising determining whether or not the characteristic value satisfies a statistical process control ⅘ rule.

17. The method of claim 7, the subtesting comprising determining whether or not the characteristic value satisfies a statistical process control 5-trend rule.

18. The method of claim 15, wherein if the characteristic value satisfies the ⅔ rule, the subtesting further comprising determining whether or not the characteristic value satisfies the statistical process control ⅘ rule.

19. The method of claim 15, wherein if the characteristic value satisfies the ⅔ rule, the subtesting further comprising determining whether or not the characteristic value satisfies the statistical process control 5-trend rule.

20. The method of claim 16, wherein if the characteristic value satisfies the ⅘ rule, the subtesting further comprising determining whether or not the characteristic value satisfies the statistical process control 5-trend rule.

21. The method of claim 18, wherein if the characteristic value satisfies the ⅘ rule, the subtesting further comprising determining whether or not the characteristic value satisfies the statistical process control 5-trend rule.

22. The method of claim 6, the subtesting comprising determining whether or not the characteristic value satisfies a statistical process control ⅔ rule, a statistical process control ⅘ rule, and a statistical process control 5-trend rule.

23. The method of claim 7, the subtesting comprising determining whether or not the characteristic value satisfies a statistical process control ⅔ rule, a statistical process control ⅘ rule, and a statistical process control 5-trend rule.

24. The method of claim 6, the subtesting comprising:
determining whether or not the characteristic value satisfies one rule of a rule group, wherein the rule group consists of a statistical process control ⅔ rule, a statistical process control ⅘ rule, and a statistical process control 5-trend rule;
selecting another different rule of the rule group, if the characteristic value satisfies said one rule of the rule group; and
determining whether or not the characteristic value satisfies said another different rule of the rule group.

25. The method of claim 7, the subtesting comprising:
determining whether or not the characteristic value satisfies one rule of a rule group, wherein the rule group consists of a statistical process control ⅔ rule, a statistical process control ⅘ rule, and a statistical process control 5-trend rule;
selecting another different rule of the rule group, if the characteristic value satisfies said one rule of the rule group; and
determining whether or not the characteristic value satisfies said another different rule of the rule group.

* * * * *